(12) United States Patent
Sakuragi

(10) Patent No.: US 8,056,045 B2
(45) Date of Patent: Nov. 8, 2011

(54) SYSTEM AND METHOD FOR CIRCUIT SIMULATION

(75) Inventor: Makoto Sakuragi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 324 days.

(21) Appl. No.: 12/314,825

(22) Filed: Dec. 17, 2008

(65) Prior Publication Data

US 2009/0172610 A1 Jul. 2, 2009

(30) Foreign Application Priority Data

Dec. 26, 2007 (JP) ................................. 2007-334658

(51) Int. Cl.
*G06F 17/50* (2006.01)
*G06F 17/10* (2006.01)

(52) U.S. Cl. ........ 716/136; 716/100; 716/101; 716/103; 716/104; 716/111; 716/123; 716/132; 716/133; 703/2; 703/14

(58) Field of Classification Search .................. 716/100, 716/101, 103, 104, 111, 123, 132, 133, 136; 703/2, 14
See application file for complete search history.

(56) References Cited

U.S. PATENT DOCUMENTS

| | | | | |
|---|---|---|---|---|
| 5,963,724 A * | 10/1999 | Mantooth et al. | ................ | 703/14 |
| 6,236,956 B1 * | 5/2001 | Mantooth et al. | ................ | 703/14 |
| 7,085,700 B2 * | 8/2006 | O'Riordan et al. | ............. | 703/14 |
| 7,236,895 B2 | 6/2007 | Sagesaka et al. | | |
| 7,606,693 B2 * | 10/2009 | Jeng et al. | ....................... | 703/14 |
| 7,813,884 B2 * | 10/2010 | Chu et al. | ........................ | 702/61 |
| 2001/0026292 A1 * | 10/2001 | Ishizaki | .......................... | 347/12 |
| 2006/0095218 A1 | 5/2006 | Sagesaka et al. | | |

(Continued)

FOREIGN PATENT DOCUMENTS

JP 10-222555 8/1998

(Continued)

OTHER PUBLICATIONS

Zhang et al.; "Research on Three-Phase Voltage-Source Selective Harmonic Elimination Inverter"; Publication Year: 2005; Transmission and Distribution Conference and Exhibition: Asia and Pacific, 2005 IEEE/PES; pp. 1-4.*

(Continued)

*Primary Examiner* — Helen Rossoshek
(74) *Attorney, Agent, or Firm* — McGinn IP Law Group, PLLC

(57) ABSTRACT

In a circuit simulation system, a storage section is configured to store a circuit data, an analysis condition data and an output data. An initial data setting section reads out the circuit data and the analysis condition data from the storage section and sets an initial data and a convergence condition for a solution calculating process based on the circuit data and the analysis condition data. A processing section generates a circuit equation to each of a voltage variable and a current variable based on the circuit data, and executes the solution calculating process based on the initial data to calculate a solution. A convergence determining section executes a convergence determining process of whether or not the solution meets the convergence condition, on the voltage variable. An output section stores the solution into the output data when it is determined to meet the convergence condition. A repetition control section controls the processing section to calculate a next solution by using the solution as the initial data, when it is determined not to meet the convergence condition.

15 Claims, 15 Drawing Sheets

U.S. PATENT DOCUMENTS

2006/0282239 A1* 12/2006 Chu et al. .................. 703/2
2008/0010329 A1* 1/2008 Kuwada .................. 708/200

FOREIGN PATENT DOCUMENTS

JP             11-110420       4/1999
JP             2006-133994     5/2006

OTHER PUBLICATIONS

Wu et al.; "New approaches in a 3-D one-carrier device solver"; Publication Year: 1989; Computer-Aided Design of Integrated Circuits and Systems, IEEE Transactions on; vol. 8, Issue: 5 pp. 528-537.*

Ng, S.W.; "Application of the variable dimension Newton method to large scale circuits"; Publication Year: 1998; Circuits and Systems, 1998. ISCAS '98. Proceedings of the 1998 IEEE International Symposium on; vol. 6; pp. 223-226 vol. 6.*

The Donald O. Pederson Center for Electronic Systems Design SPICE (http://embedded.eecs.berkeley.edu/pubs/downloads/spice/index.htm) Dec. 26, 2007.

* cited by examiner

Fig. 3 RELATED ART

| i | V | I | DETERMINATION |
|---|---|---|---|
| 1 | × | × | NO CONVERGENCE |
| 2 | × | × | NO CONVERGENCE |
| ⋮ | ⋮ | ⋮ | ⋮ |
| n−1 | × | × | NO CONVERGENCE |
| n | ○ | × | NO CONVERGENCE |
| ⋮ | ⋮ | ⋮ | ⋮ |
| m−1 | ○ | × | NO CONVERGENCE |
| m | ○ | ○ | CONVERGENCE |

Fig. 7

| i | V | I | DETERMINATION |
|---|---|---|---|
| 1 | × | × | NO CONVERGENCE |
| 2 | × | × | NO CONVERGENCE |
| ⋮ | ⋮ | ⋮ | ⋮ |
| n-1 | × | × | NO CONVERGENCE |
| n | ○ | × | CONVERGENCE |

SYSTEM AND METHOD FOR CIRCUIT SIMULATION

INCORPORATION BY REFERENCE

This patent application claims a priority on convention based on Japanese Patent Application 2007-334658. The disclosure thereof is incorporated herein by reference.

BACKGROUND OF THE INVENTION

1. Field of the Invention

The present invention relates to circuit simulation of a semiconductor integrated circuit, and more specifically, to a circuit simulation method in a designing process of the semiconductor integrated circuit, and a circuit simulation system.

2. Description of Related Art

In recent years, the scale of a semiconductor integrated circuit has been made large and a time necessary to analyze a circuit is increasing in the design and development of the semiconductor integrated circuit. A circuit simulation program such as SPICE is frequently used for the analysis of the circuit. An analyzing method in the SPICE is well known, and is shown in the Web Site (http://embedded.eecs.berkeley.edu/pubs/downloads/spice/index.htm). Although there is no flowchart, a source code of the SPICE has been opened.

A circuit simulation method of analyzing a circuit at high speed by using the SPICE is disclosed in Japanese Patent Application Publications (JP-A-Heisei 10-222555, JP-A-Heisei 11-110420, JP-P2006-133994A. In Japanese Patent Application Publication (JP-A-Heisei 10-222555), a circuit is divided into a plurality of sectional circuits and analyzed, and in Japanese Patent Application Publication (JP-A-Heisei 11-110420), a circuit is analyzed in advance while a precision parameter is varied. Japanese Patent Application Publication (JP-P2006-133994A) discloses that a current value or a voltage value is calculated.

In the circuit simulation program represented by SPICE, a circuit equation is generated based on Kirchhoff's voltage law and current law to express connections in the circuit. The circuit equation is represented as a matrix, and the circuit is analyzed through calculation of the matrix. That is, based on data of elements contained in the circuit and data of connections of them, the equation $F(X)=0$ is defined, in which a solution X (=unknown variable) is a value of a voltage (=voltage variable) at each of nodes in the circuit and a value of a current (=current variable) flowing through each of the elements.

An iterative solution method such as the Newton iteration method is generally used for calculation of the solution of the circuit equation. The Newton iteration method is a technique of calculating an approximate solution of a true solution satisfying the equation $F(X)=0$, by specifying a variable i indicating the number of times of the iteration, and repeating calculation of a value of the $i^{th}$ unknown variable $X^{(i)}$ by using a value of the $(i-1)^{th}$ unknown variable $X^{(i-1)}$. It is called convergence that an amount of change of the unknown variable X settles in a tolerance specified in advance, and a process is completed assuming that the solution has been calculated at that time.

FIG. 4 is a block diagram showing the configuration of a conventional circuit simulation system. Referring to FIG. 4, the conventional circuit simulation system includes a storage unit 1, an analysis processing section 2, and a calculation result outputting unit 7.

The storage unit 1 is exemplified by a hard disk drive and is connected to an I/O interface 4. The storage unit 1 stores a circuit data 10 specifying the circuit configuration such as data indicating elements contained in a circuit and connections of them, and an analysis condition data 20 as a setting data used for performing analysis such as an analysis start time, and an analysis end time. Moreover, an analysis result is stored in the storage unit 1 as a waveform data 40.

The analysis processing section 2 has a CPU 3, an I/O interface 4, a ROM (Read Only Memory) 5, and a RAM (Random Access Memory) 6. In the analysis processing section 2, a circuit simulation program is loaded into the RAM 6 via the CPU 3, and the CPU 3 executes it. An execution result is stored in the storage unit 1 via the I/O interface 4, and is outputted to the calculation result outputting unit 7. The calculation result outputting unit 7 is exemplified by a display, a printer, and a file system, and is connected to the I/O interface 4, and outputs the analysis result of the analysis processing section 2.

Next, an operation method of the conventional circuit simulation system will be described. FIG. 1 is a flowchart showing the conventional circuit simulation method.

First, the circuit simulation is started (Step S100). The circuit data 10 and the analysis condition data 20 are read from the storage unit 1 (Step S101). As described above, the circuit data specifies the configuration of the circuit to be analyzed, and contains data indicating the elements in the circuit and connections of them. The analysis condition data is the setting data for performing analysis, which includes a data indicating the tolerance of accuracy.

Next, an initial value set of the Newton iteration method is set. Moreover, a counter variable i indicates the number of times of the iteration of the Newton iteration method and is set to "1" (Step S102).

A circuit equation is generated based on the circuit data 10, and an approximating process of calculating a solution is executed in which the circuit equation is approximately solved by the Newton iteration method (Step S 103). The process of calculating the solution of the circuit equation is matrix calculation. As the circuit scale becomes larger, the matrix scale becomes larger and the number of times of the operation increases exponentially. Specifically, the number of times of the calculation is the number of times of the updating calculation when erasing variables in a LU (Lower/Upper) decomposition of the circuit matrix into a product of triangular matrixes. It is generally known that the number of times of the calculation increases in proportion to the third power of a matrix size.

It is determined whether the solution of the circuit equation in the approximating process has been converged through the iterative calculation (Step S104). Conditional branching is performed based on a result of convergence determining process (Step S105).

When it is determined that the solution has converged (Yes at Step S105), the solution of the circuit equation is saved as the waveform data 40 in the storage unit 1 (Step S108). Then, the operation follow is completed (Step S109).

When the solution has not converged (No at Step S105), it is determined whether the counter variable i has exceeded a predetermined number of times of the iteration ITL1 (Step S106). When it exceeds an upper limit (Yes at Step S106), it is determined to be in error and the operation flow is completed (Step S107). When it does not exceed the upper limit (No at Step S106), the Step S113 is carried out.

At Step S113, the counter variable i is incremented by "1" (Step S113), and the operation flow returns again to the Step S103. The values calculated at the last Step S103 are used as the initial value set, and the process of calculating a solution is executed, like the last time. Therefore, the number of times of the operation required to calculate the solution can be expressed as follows:

(Number of times of the operation required to calculate a solution)=(Number of times of the operation per iteration of Newton iteration method)×(Number of times of the iteration required until convergence)

The number of times of the operation per iteration of the Newton iteration method can be found at the Step S103, and the number of times of the iteration of the Newton iteration method required until convergence can be found as a value of the counter variable i at the Step S108. Thus, the number of times of the operation required to calculate the solution can be expressed as a product of these numbers of times. A simulation time is dependent on the number of times of the operation required to calculate the solution.

FIG. 2 is a flowchart showing a convergence determining process of the Step S104 of FIG. 1 in detail. First, when the Step S104 is started (Step S500), a convergence variable flag eflg is initialized to zero (Step S509). The convergence variable flag eflg indicates whether there is a variable that has not converged, among variables of the unknown variable X. When the convergence variable flag eflg is "1," it indicates that one or more variables included in the unknown variable X are not in a state of non-convergence; and when the convergence variable flag eflg is "0," it indicates that all the variables are in a state of convergence.

Next, the following process is performed on all the variables included in the unknown variable X. It is evaluated over all the variables whether a difference between the present solution $x^{(i)}$ of the variable x included in the unknown variable X and a last time solution $x^{(i-1)}$ thereof, is within a tolerance (Step S501). When the solution has not converged, it is determined that there is a variable not having converged in the variable X, and the convergence variable flag eflg is set to "1" (Step S507). After that, it is determined whether there is an undetermined variable (Step S502). When there is the undetermined variable (Yes at Step S502), the next variable is evaluated (Step S508). By repeating this, the convergence determining process is made in sequence on all the variables included in the unknown variable X.

When there is no undetermined variable (No at Step S502), the convergence determining process is completed (Step S504).

FIG. 3 is a table showing a convergence determination result. In FIG. 3, "i" represents a value of the counter variable of the Newton iteration method. Regarding "V" and "I," when a set of voltage variables included in a set of unknown variables X is specified as V (V=($x_v$|$x_v$ is a voltage variable, and X includes $x_v$)) and a set of current variables included in the set of unknown variables X is specified as I (I=($x_i$|$x_i$ is a voltage variable, and X includes $x_i$)). A symbol "O" indicates a case that all the elements in each set have converged, and a symbol "X" indicates a case that any of the elements therein has not converged. Here, X is a logical OR of V and I. A column of "determination" shows the convergence determination result of Step S104.

First, at the Step S103 of FIG. 1, when the counter variable i of the Newton iteration method varies to a value not exceeding an upper limit ITL1 of the number of times of the iteration, i.e., a value (n−1) (n: natural number), the variable sets V and I result in non-convergence. At this time, when the counter variable i is incremented to n, namely when the $n^{th}$ iteration process is executed, the sets V and I of FIG. 3 result in non-convergence. At the Step S103, the generation of the circuit equation and the process of calculating the solution by the Newton iteration method by using the $(n-1)^{th}$ solution as an initial value set are performed.

Next, at the Step S104, it is determined whether a value of $X^n - X^{(n-1)}$ stays in the tolerance, that is, whether a difference between the present solution $x^{(i)}$ and the last solution $x^{(i-1)}$ is within the tolerance for the variable x included in the unknown variable X. Here, in FIG. 3, the set V has converged, but the set I has not converged. Therefore, it is determined that the result of the Step S104 is non-convergence. For this reason, the iteration process for the $(n+1)^{th}$ iteration and succeeding iterations are carried out again. In this way, the Newton iteration method is carried out repeatedly until the solutions included in the set V and the set I are all converged, and the number of times of the iteration required until calculating the solution becomes m (n<m).

The process of calculating the solution at the Step S103 is repeated due to the result of the convergence determining process at the Step S104. Even when the voltage variable has converged, the process of calculating the solution and the convergence determining process are repeated until all the variables have converged.

As described above, in the conventional circuit simulation method, since a predetermined determining process is executed to a change in the variable and the solution, the number of times of the iteration increases and a circuit simulation time elongates depending on a circuit size.

Therefore, a circuit simulation method is demanded in which the number of times of the operation of the Newton iteration method until convergence is attained can be reduced by changing a method of convergence determination based on the solution of a variable included in an unknown variable X, and also, the number of times of the operation required to calculate the solution can be reduced as a whole, and a circuit simulation system therefore.

SUMMARY

In an aspect of the present invention, a circuit simulation system includes: a storage section configured to store a circuit data, an analysis condition data and an output data; an initial data setting section configured to read out the circuit data and the analysis condition data from the storage section and set an initial data and a convergence condition for a solution calculating process based on the circuit data and the analysis condition data; a processing section configured to generate a circuit equation to each of a voltage variable and a current variable based on the circuit data, and execute the solution calculating process based on the initial data to calculate a solution; a convergence determining section configured to execute a convergence determining process of whether or not the solution meets the convergence condition, on the voltage variable; an output section configured to store the solution into the output data when it is determined to meet the convergence condition; and a repetition control section configured to control the processing section to calculate a next solution by using the solution as the initial data, when it is determined not to meet the convergence condition.

In another aspect of the present invention, a circuit simulation method is achieved by setting an initial data and a convergence condition for a solution calculating process from a circuit data and an analysis condition data; by generating a circuit equation to each of a voltage variable and a current variable based on the circuit data; by executing the solution calculating process based on the initial data to calculate a solution; by executing a convergence determining process of whether or not the solution meets the convergence condition, on the voltage variable; by storing the solution into an storage section when it is determined to meet the convergence condition; and by executing the solution calculating process and the convergence determining process by using the solution as the initial data, when it is determined not to meet the convergence condition.

In still another aspect of the present invention, a computer-readable recording medium in which a computer-executable program code is recorded for realizing a circuit simulation method which includes: setting an initial data and a convergence condition for a solution calculating process from a circuit data and an analysis condition data; generating a circuit equation to each of a voltage variable and a current variable based on the circuit data; executing the solution calculating process based on the initial data to calculate a solution; executing a convergence determining process of whether or not the solution meets the convergence condition, on the voltage variable; storing the solution into an storage section when it is determined to meet the convergence condition; and executing the solution calculating process and the convergence determining process by using the solution as the initial data, when it is determined not to meet the convergence condition.

As described above, the present invention provides a circuit simulation method, a circuit simulation system, and a circuit simulation program all of that decrease the number of times of the iteration of Newton iteration method required until convergence and thereby decrease the number of times of the operation required to obtain a solution on the whole by changing the convergence determination method in response to the solution of the variable with respect to the unknown variable X.

BRIEF DESCRIPTION OF THE DRAWINGS

The above and other objects, advantages and features of the present invention will be more apparent from the following description of certain embodiments taken in conjunction with the accompanying drawings, in which:

FIG. 3 is a table showing a convergence determination result in the circuit simulation method of the conventional technique;

FIG. 7 shows a table of the convergence determination result in the circuit simulation method according to the first embodiment of the present invention;

DESCRIPTION OF THE PREFERRED EMBODIMENTS

Hereinafter, a circuit simulation system according to the present invention will be described with reference to the attached drawings.

Figure 1:
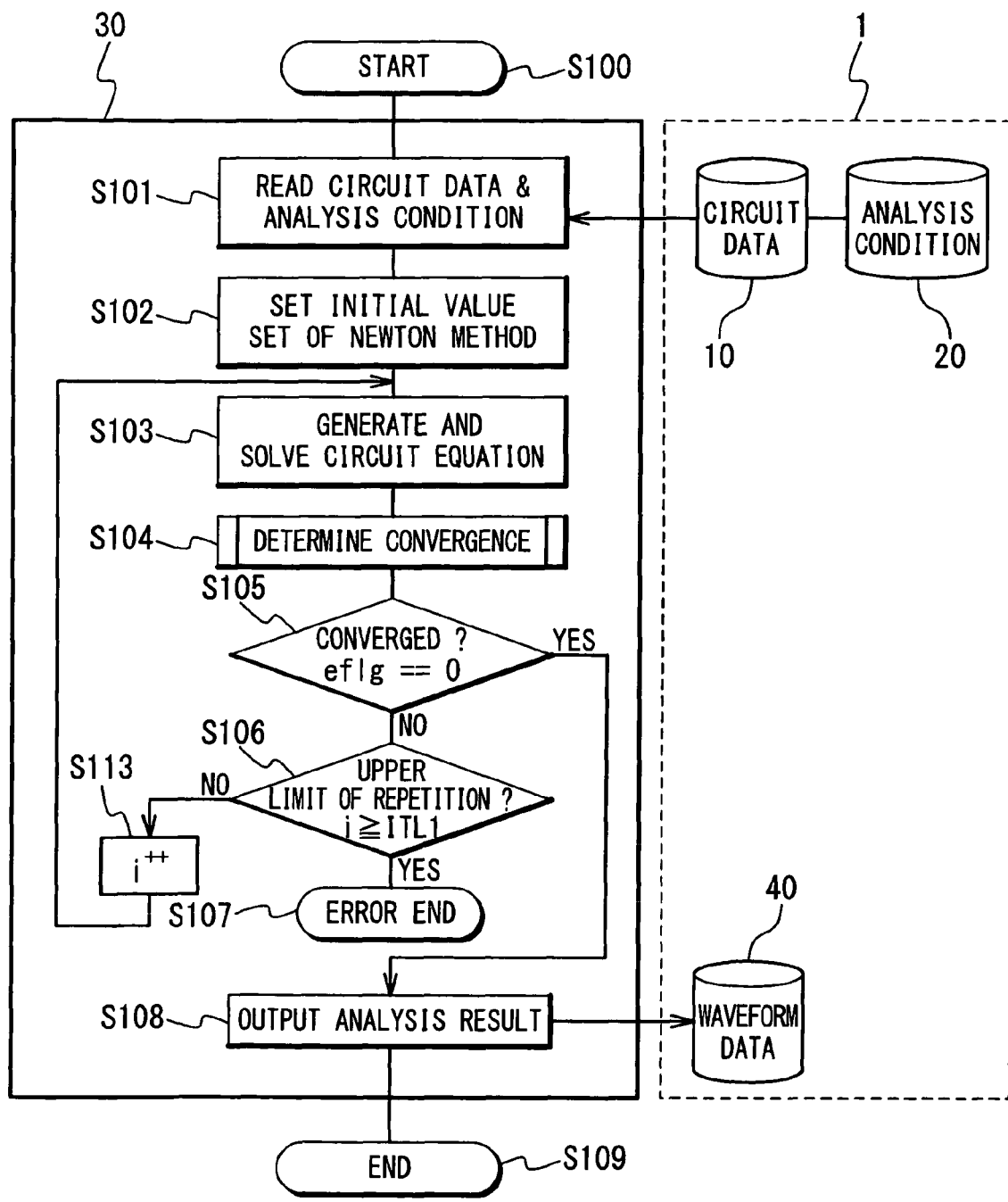
FIG. 1 is a flowchart in a circuit simulation method of a conventional technique.
Figure 2:
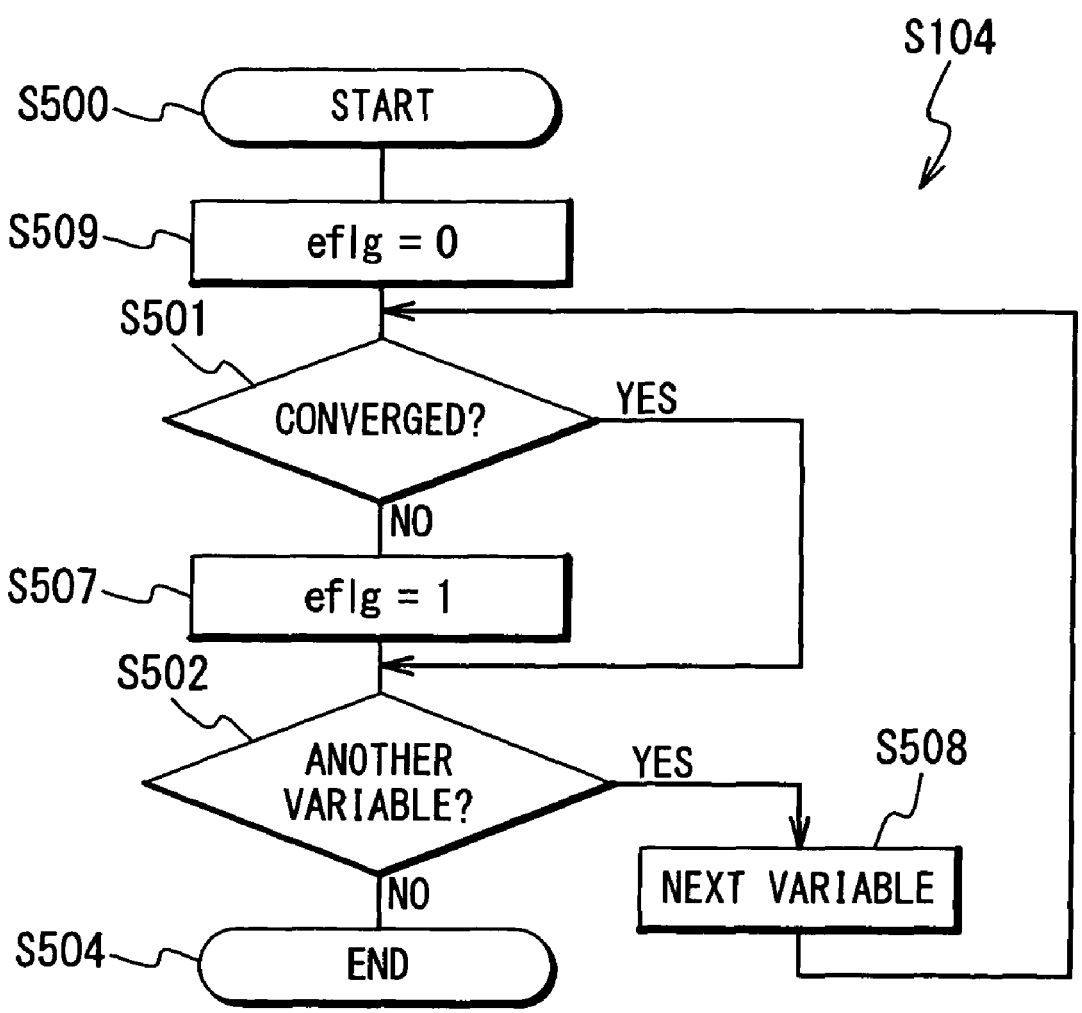
FIG. 2 is a flowchart showing in detail a convergence determining process in the circuit simulation method of the conventional technique.
Figure 4:
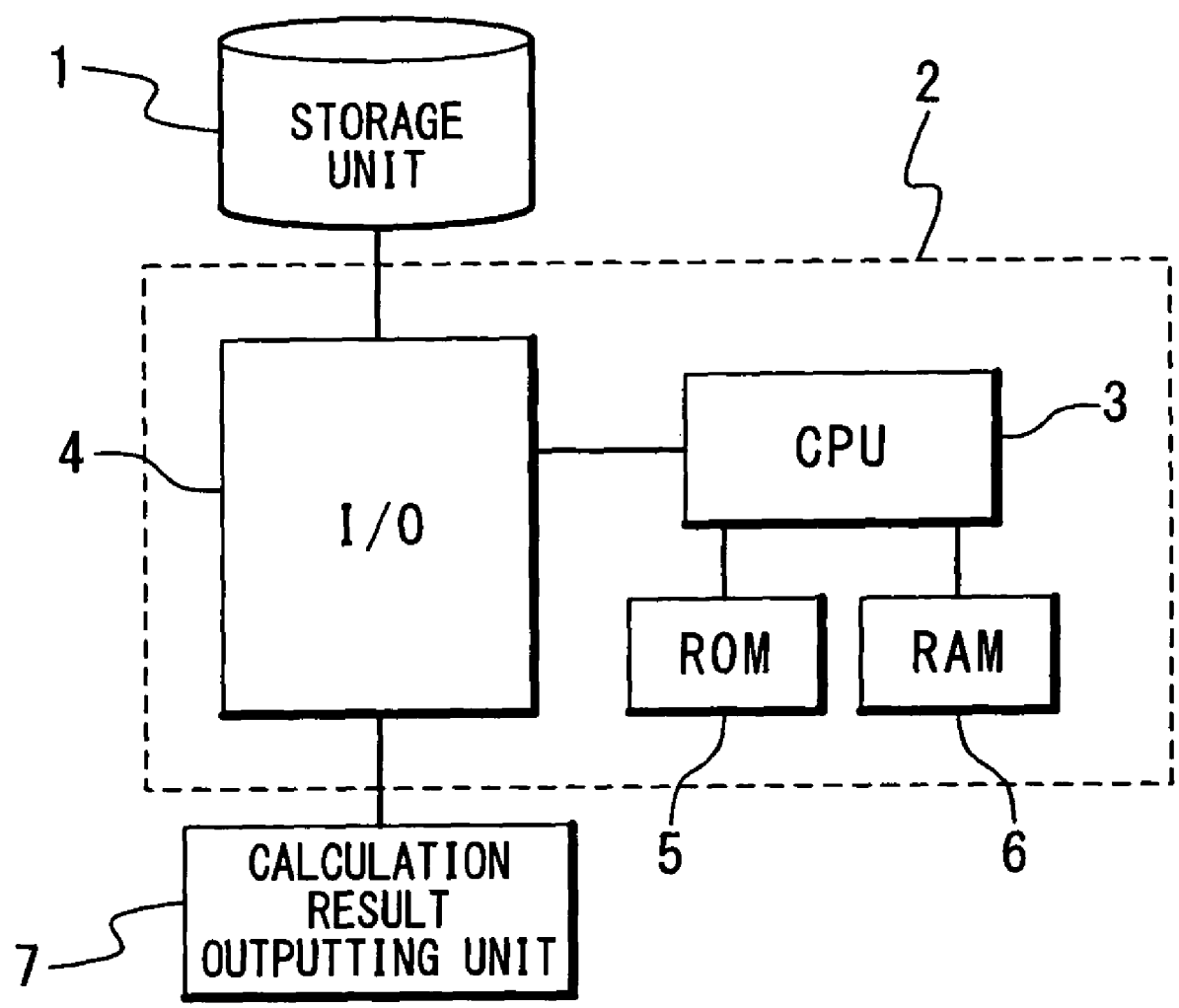
FIG. 4 is a system configuration diagram for executing a circuit simulation method.

FIG. 4 is a block diagram showing a configuration of the circuit simulation system according to the present invention. Referring to FIG. 4, the circuit simulation system includes a storage unit 1, an analysis processing section 2, and a calculation result outputting unit 7.

The storage unit 1 is exemplified by a hard disk drive and is connected to an I/O interface 4. The storage unit 1 stores a circuit simulation program loaded therein from a recording medium. Also, the storage unit 1 stores a circuit data 10 for specifying a configuration of a circuit to be analyzed such as data indicating elements included in the circuit and connections of them, and an analysis condition data 20 that is a setting data used for performing analysis of the circuit such as data indicating an analysis start time and an analysis end time. The circuit data 10 includes data of elements and data of nodes to which the elements are connected. For example, it is data indicating that a voltage source element V1 for 1 V is connected to nodes n1 and n2. The analysis condition data 20 includes a tolerance. For example, it includes parameters such as an error tolerance value reltol and a voltage absolute error tolerance value vntol, and the tolerance is determined based on the parameters.

The analysis processing section 2 has a CPU 3, an I/O interface 4, a ROM (Read Only Memory) 5, and a RAM (Random Access Memory) 6. The analysis processing section 2 is realized based on a circuit simulation program read from the storage unit 1 into the RAM 6 by the CPU 3 and executed by the CPU 3. An execution result is stored in the storage unit 1 as a waveform data 40 via the I/O interface 4, and is outputted to the calculation result outputting unit 7 via the I/O interface 4.

The calculation result outputting unit 7 is exemplified by a display, a printer, and a file system, and is connected to the I/O interface 4 of the analysis processing section 2, and outputs the analysis result of the analysis processing section 2.

Figure 5:
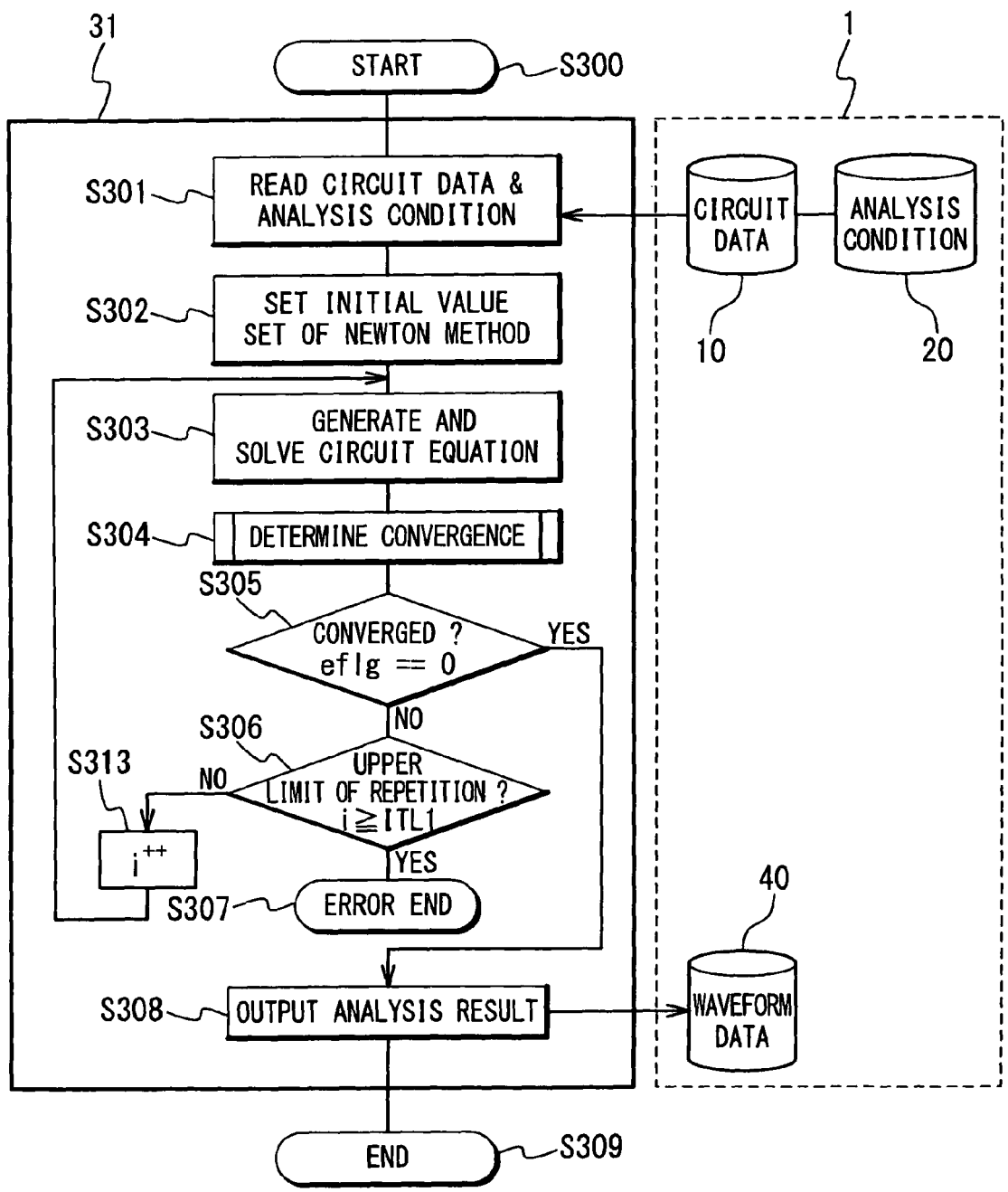
FIG. 5 is a flowchart showing the circuit simulation method according to a first embodiment of the present invention.

Next, an operation of the circuit simulation system of the present invention will be described. FIG. 5 is a flowchart showing the operation of a circuit simulation system according to a first embodiment of the present invention. Referring to FIG. 5, a simulation method includes a circuit data & analysis condition reading process (Step S301), a Newton iteration method initial value setting process (Step S302), a circuit equation generating & solving process (Step S303), a convergence determining process (Step S304), a process of performing a conditional branch based on a convergence determination result (Step S305), a process of determining whether exceeding an upper limit of the number of times of iteration (Step S306), an error process (Step S307), an analysis result outputting process (Step S308), and a process of incrementing a counter variable of the Newton iteration method (Step S313).

First, the CPU 3 reads the circuit simulation program from the storage unit 1, loads it in the RAM 3, and executes it to start the circuit simulation (Step S300). The circuit data 10 and the analysis condition data 20 are also read from the storage unit 1 (Step S301).

Next, an initial value set of the Newton iteration method is set based on the analysis condition data. Moreover, "1" is set to a counter variable i indicating the number of times of the iteration of the Newton iteration method (Step S302). A circuit equation is generated based on the circuit data 10, the coefficients are developed in the RAM 3 as a matrix, and a process of calculating the solution of the circuit equation is executed (Step S303). The process of calculating the solution is executed for all the variables in the unknown variable.

It is determined whether the solution of the circuit equation obtained at Step S303 has converged by the iterative calculation, based on whether the solution is within a convergence determination value which is predetermined based on the analysis condition data (Step S304). The convergence determining process is executed each time the Newton iteration method is repeated. However, the second and later iterations are performed based on a result of whether a difference between the last solution and present solution is within the convergence determination value. The conditional branching is performed based on the convergence determination result (Step S305). Specifically, it is determined whether the variable flag eflg set at Step S304 is "0."

When it is determined that it has converged, the solution of the circuit equation is saved as an analysis value in the waveform data 40 (Step S308), and the process is completed (Step S309).

When not having converged, it is determined whether the counter variable i of the Newton iteration method exceeds the number of times of the iteration ITL1 which is determined in advance based on the analysis condition data (Step S306). When the counter variable i does not exceed the upper limit, the counter variable i is incremented (Step S313), and an operation flow returns to Step S303 again, and the value set calculated at the last Step S303 is substituted as an initial value set and the process of calculating the solution is executed like the last time.

Figure 6:
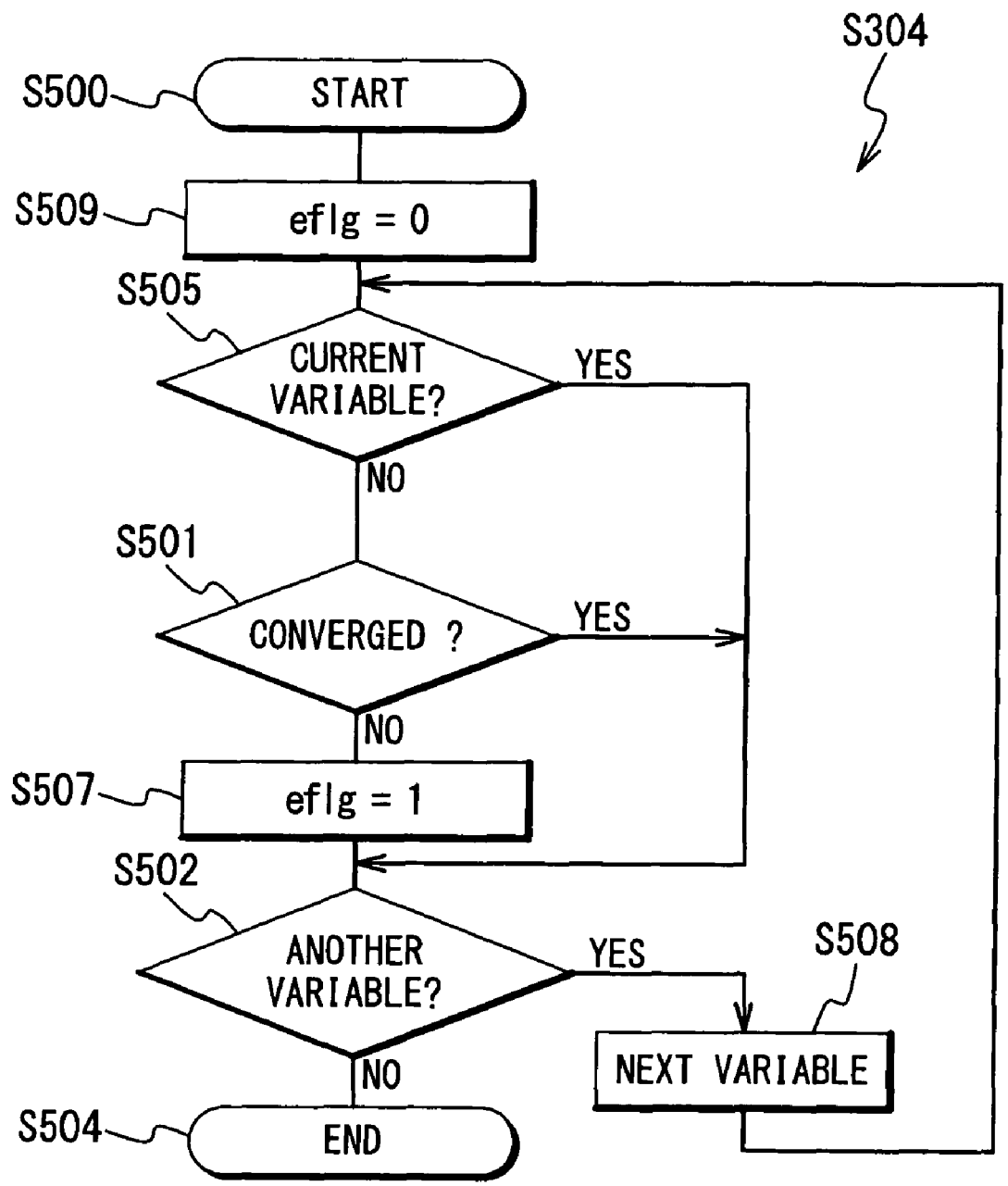
FIG. 6 is a flowchart showing a convergence determining process in the circuit simulation method according to the first embodiment of the present invention.

FIG. 6 is a flowchart showing the convergence determining process of Step S304 of FIG. 5 in detail. Firstly, when the process of Step S304 is started (Step S500), the variable flag eflg is initialized to "0" (Step S509). The variable flag eflg indicates whether each variable of the unknown variable X has converged. When the variable flag eflg is "1," it means that one or more variables included in the unknown variable X have not converged; and when the variable flag eflg is "0," it means that all the variables have converged.

The following process is executed for all the variables included in the unknown variable X. Firstly, it is determined whether a present variable is a current variable (Step S505), and when not being the current variable, the convergence determining process is executed (Step S501). When not having converged, it is determined that there is a variable not having converged in the unknown variable X, and the variable flag eflg is set to "1" (Step S507). Subsequently, Step S502 is carried out. On the other hand, when it is the current variable, Step S502 is carried out.

At the Step S502, it is determined whether an undetermined variable exists. When the undetermined variable exists (Yes at Step S502), the next variable is selected (Step S508), and the operation flow returns to the Step S505. Thus, the determination is carried out on a next variable. By repeating this, the convergence determination is made in sequence on all the variables included in the unknown variable X. When there is no undetermined variable (No at Step S502), the convergence determining process is completed (Step S504). Therefore, the convergence determining method changes according to each of the variable of the unknown variable X.

FIG. 7 is a table showing the convergence determination result in the circuit simulation method according to the present embodiment. FIG. 7 shows a result when the circuit simulation method according to the present embodiment is carried out on the convergence determination result of the conventional circuit simulation method shown in FIG. 3. It should be noted that FIG. 7 and FIG. 3 are results of the analysis of a same circuit.

Firstly, in the Step S303 of FIG. 5, the counter variable i of the Newton iteration method is assumed to be in a state of "n" (natural number) that does not exceed the upper limit ITL1 of the number of times of the iteration. That is, when the $n^{th}$ iterative operation is performed from this state, the sets V and I result in non-convergence, like the case in FIG. 3.

At the Step S303, the generation of the circuit equation and the process of calculating the solution of the Newton iteration method by using a solution of an $(n-1)^{th}$ iteration as the initial value set are carried out.

Next, at the Step S304, it is determined whether $|X^n - X^{(n-1)}|$ is within a tolerance, namely whether a difference between the present solution $x^{(i)}$ and the last solution $x^{(i-1)}$ is within the tolerance for the variable x included in the unknown variable X. However, the object of the convergence determining process is only a voltage variable by the Step S505. For this reason, it is determined based on the set V whether it has converged. Here, since the set V has converged as shown in FIG. 7, it is determined that the Step S304 results in convergence, and the number of times of the iteration of the Newton iteration method required to obtain the solution is n (n<m).

In this way, the number of times of the iteration of the Newton iteration method required to obtain the solution is n times that are less than m times. Since the number of times of the operation required until calculating the solution can be expressed by a product of the average number of times of the operation per iteration of the Newton iteration method and the number of times of the iteration required until calculating the solution, the number of times of the operation of the circuit simulation method according to the first embodiment is n/m (n<m) times as large as that of the conventional technique.

Figure 10:
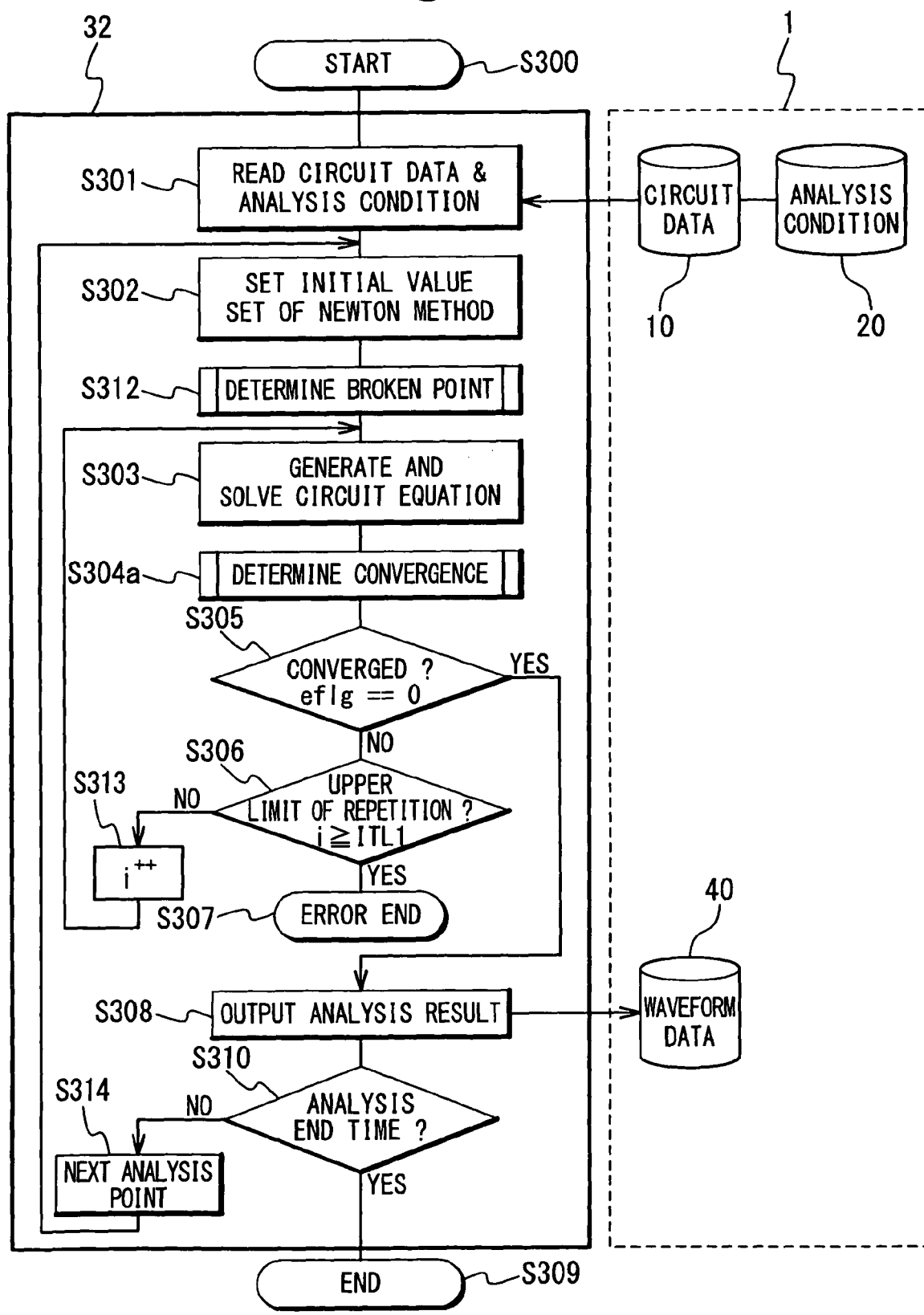
FIG. 10 is a flowchart of a transient analysis in the circuit simulation method according to a second embodiment of the present invention.

Next, FIG. 10 is a flowchart showing a procedure of the circuit simulation method by a second embodiment of the present invention. A configuration of the circuit simulation system according to the second embodiment of the present invention is the same as the configuration shown in FIG. 4. In the second embodiment, a transient analysis is further performed in the circuit simulation.

Figure 8:
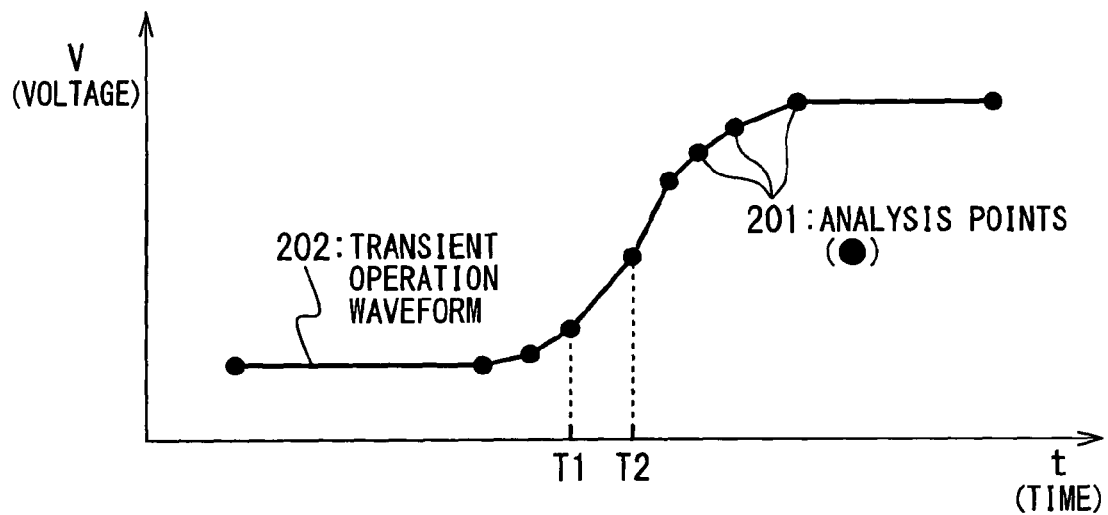
FIG. 8 is a waveform diagram showing an analysis result of the circuit simulation method through a transient analysis.
Figure 9:
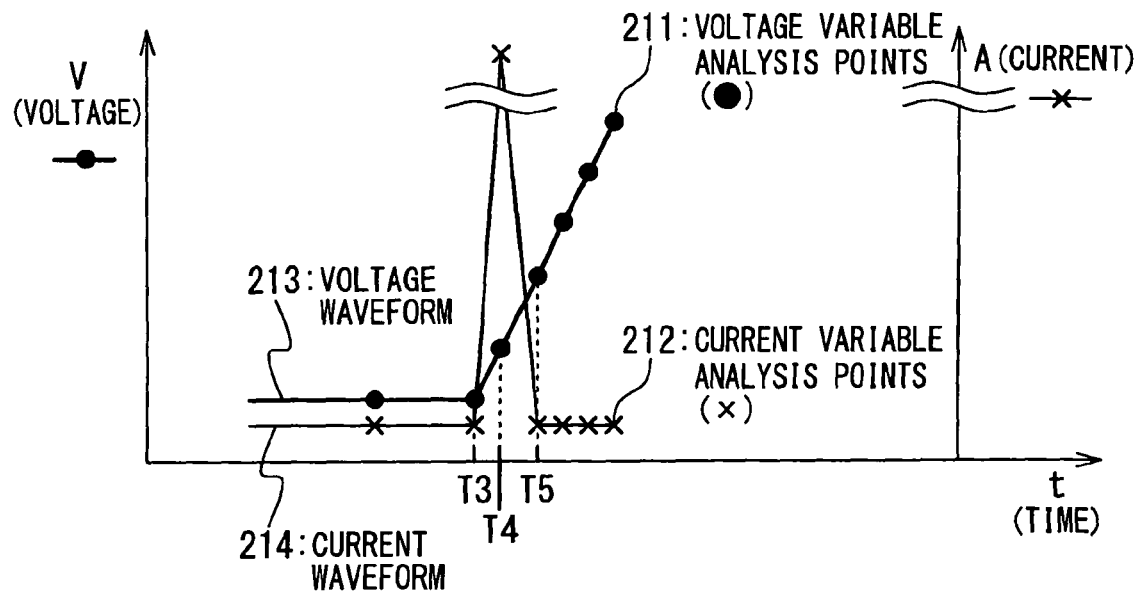
FIG. 9 is a waveform diagram showing a spike form of a current waveform that may be generated when the convergence determination of the current variable is omitted.

Referring to FIGS. 8 and 9, the transient analysis will be described. FIG. 8 is a waveform diagram of a transient analysis result, in which a horizontal axis represents time and a vertical axis represents a voltage. A transient operation waveform 202 that connects analysis points 201 is shown.

The transient analysis is for analyzing a response characteristic in a time domain at a certain specified node, and the circuit simulation method is performed from the analysis start time to the analysis end time for every discrete time. The discrete time, the analysis start time, and the analysis end time are set based on the analysis condition data. When the solution of the circuit equation has converged at an analysis point at certain time T1, time T2 is selected as a next time, and the process of solving of the circuit equation is executed again. In order to calculate the solution in a small number of times of the iteration, a value predicted from the solution at time T1 is used as an initial value set of the Newton iteration method in the process of calculating the solution at time T2. The number of times of the operation required until the transient-analysis end time, which corresponds to an execution time of the transient analysis, will be described. A product of the number of times of the operation per iteration of the Newton iteration method and the number of times of the iteration at a certain analysis point becomes equal to the number of times of the operation per analysis point. A product of an average of the number of times of the operation per analysis point and the number of analysis points becomes the number of times of the operation required to calculate the solution of the transient analysis.

FIG. 9 is a waveform diagram showing a spike form of a current waveform, and a voltage waveform 213 is shown by connecting analysis points 211 of the voltage variable. Similarly, a current waveform 214 is shown by connecting analysis points 212 of the current variable. In the spike form of the current waveform 214, the analysis point 212 of the current variable is outputted as a large value as would not occur actually when the voltage waveform 213 changes abruptly from time T3 to times T4 and T5 in a temporal transit. An accuracy in the current waveform is low in the spike form. The initial value set of the Newton iteration method at a certain time is a solution of the last time, and the solution of the current variable converges sufficiently in analysis points where the voltage changes gently. However, in analysis points where the voltage changes abruptly, the solution of the current variable is outputted as an analysis result before it converges sufficiently. Therefore, the spike form appears.

FIG. 10 is a flowchart of the circuit simulation method performed by the CPU 3 executing the circuit simulation program. In this flowchart, Steps S310 and S312 are added to the flowchart showing the operation of the circuit simulation system in the first embodiment of FIG. 5, and Step S304 is replaced by Step S304a. The other steps are common, and consequently they are assigned with the same symbols.

In FIG. 10, Step S310 is carried out just after the solution at a certain analysis point has successfully calculated and the analysis result has outputted. At the Step S310, it is determined whether a present analysis time has reached at the analysis end time which is determined in advance. When it has reached at the analysis end time, the operation flow is completed (Step S309). When it has not yet reached at the analysis end time, the analysis time is set at a next analysis point, and the operation flow returns to the Step S302.

Moreover, at Step S312, it is determined whether the present analysis time is a slow change point or a break point. The break point signifies a time at which a voltage value is specified to change in a plurality of voltage sources existing in the circuit. Next, referring to a flowchart shown in FIG. 11, details of the Step S312 of FIG. 10 will be described. The Step S312 is carried out once for every analysis time (Step S600).

Firstly, at Step S601, whether the present analysis time exists in the vicinity of a voltage change point is checked over for all the voltage sources in the circuit. The analysis time is checked based on a criterion of "vicinity." The analysis times of a predetermined number from the voltage change point (designated as the number of convergence determination steps Nstep) are considered as a target. The number of convergence determination steps Nstep is a variable that is set inside the circuit simulation program, and is fixed whenever the convergence determination step is carried out.

Next, a vicinity variable flag cflg is set based on the determination result at the Step S601. The vicinity variable flag cflg indicates whether the present analysis time is in the vicinity of the break point. The present analysis time in case of the vicinity variable flag cflg of "1" is the vicinity of the change point that the voltage of any one of the voltage sources in the circuit changes. Moreover, the present analysis time in case of the vicinity variable flag cflg of "0" is on the analysis point that the voltages of all the voltage sources in the circuit do not change. When the determination is made to be Yes at the Step S601, the vicinity variable flag cflg is set to "1" (Step S605). On the other hand, when the determination is made to be No at the Step S601, the vicinity variable flag cflg is set to "0" (Step S604). When the set of the vicinity variable flag cflg ends, the operation flow is completed (Step S602).

Figure 12:
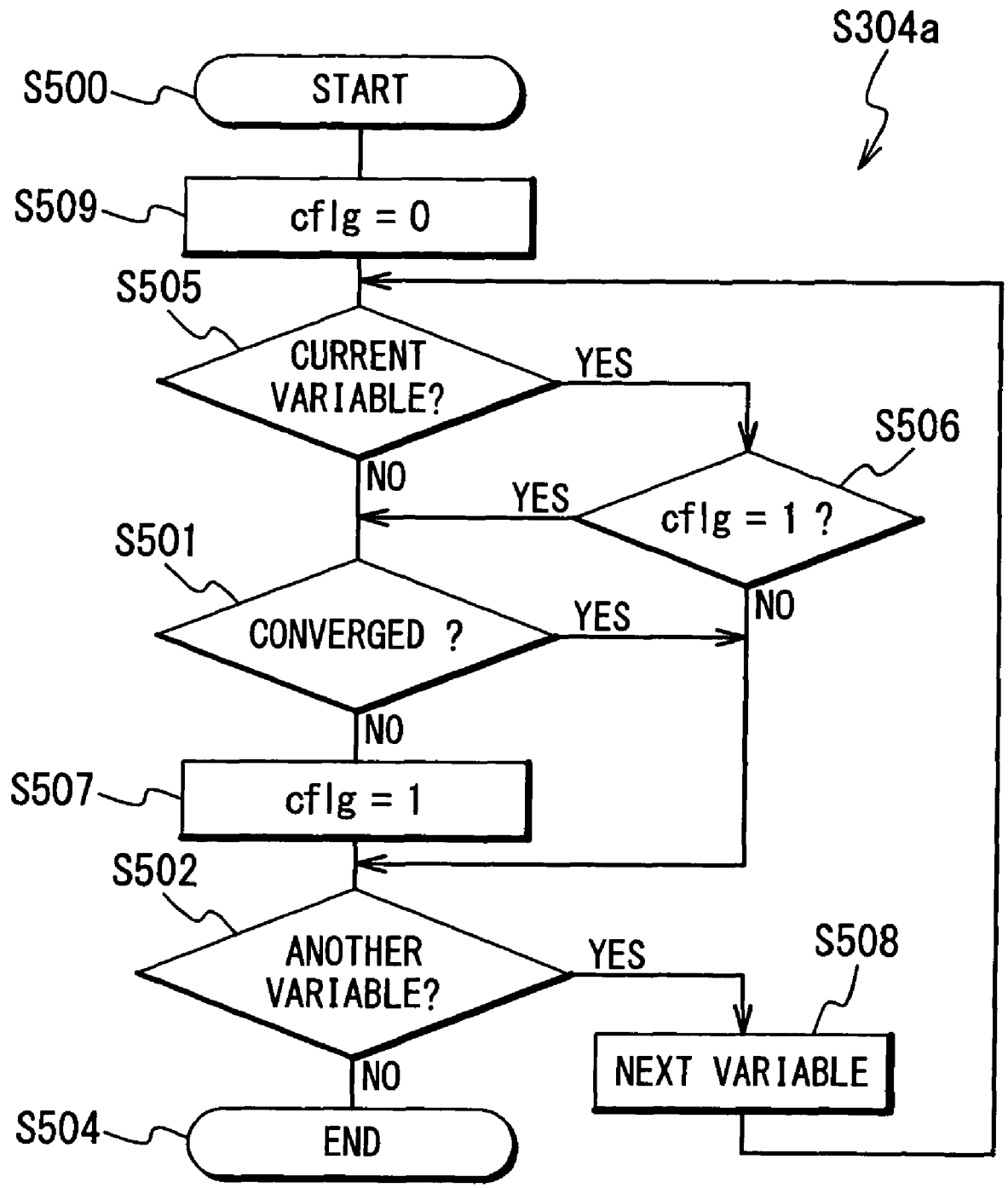
FIG. 12 is a flowchart showing the convergence determining process in the circuit simulation method according to the second embodiment of the present invention.

FIG. 12 shows details of the convergence determining process (Step S304a), which is executed each time whenever the Newton iteration method is repeated. In the Steps S304a, Step S506 is added to the Step S304.

When the present variable is determined to be the current variable (Yes at Step S505), it is determined whether the vicinity variable flag cflg is "1" (Step S506). When the vicinity variable flag cflg is "1", the convergence determining process (Step S501) is executed. Therefore, when it is determined at the Step S601 of FIG. 11 that the present analysis time is in the vicinity of the voltage change point, the current variable is determined as a convergence determination object at Step S506 of FIG. 12. On the other hand, when it is determined that the analysis time is a point other than the vicinity of the voltage change point, the convergence determination of the current variable is not carried out, like the first embodiment.

Figure 13:
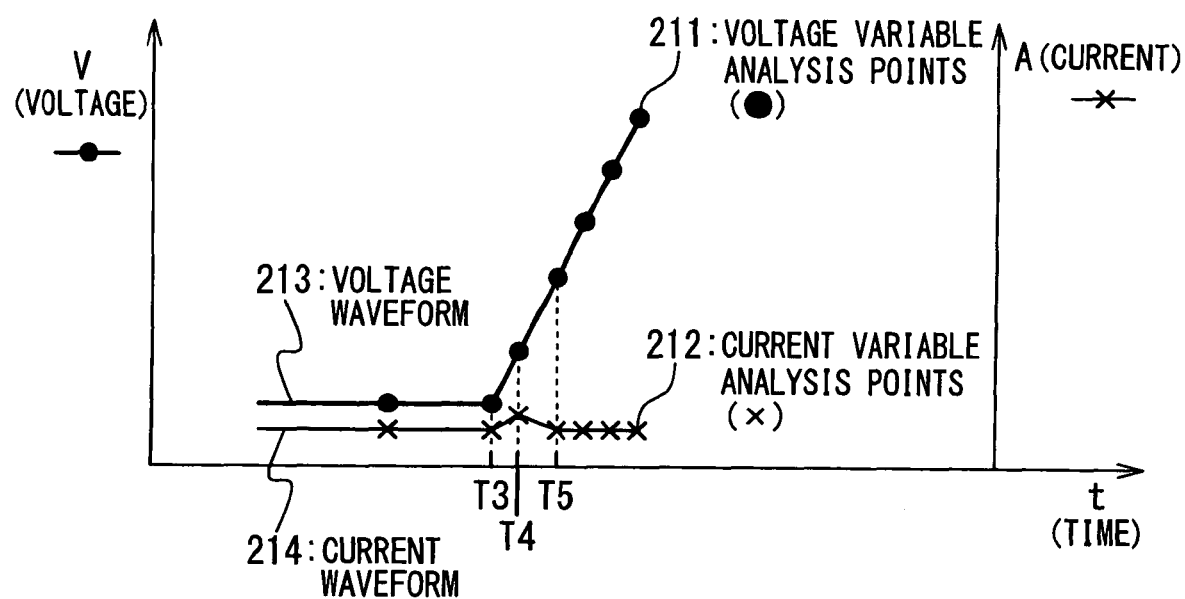
FIG. 13 is a waveform diagram showing that the circuit simulation method according to the second embodiment of the present invention improves accuracy.

As stated above, in the second embodiment of the present invention, the convergence determining process of the current variable is not executed at an analysis point that is other than the vicinity of the voltage change point and shows a gentle change in voltage, whereas the convergence determining process is executed on both the voltage variable and the current variable at an analysis point that shows an abrupt change in voltage. Therefore, at the analysis times T3, T4, and T5 shown in FIG. 13, the current waveform 214 does not have the spike form in the second embodiment. As already discussed above, an accuracy of the current waveform improves in the second embodiment.

Figure 14:
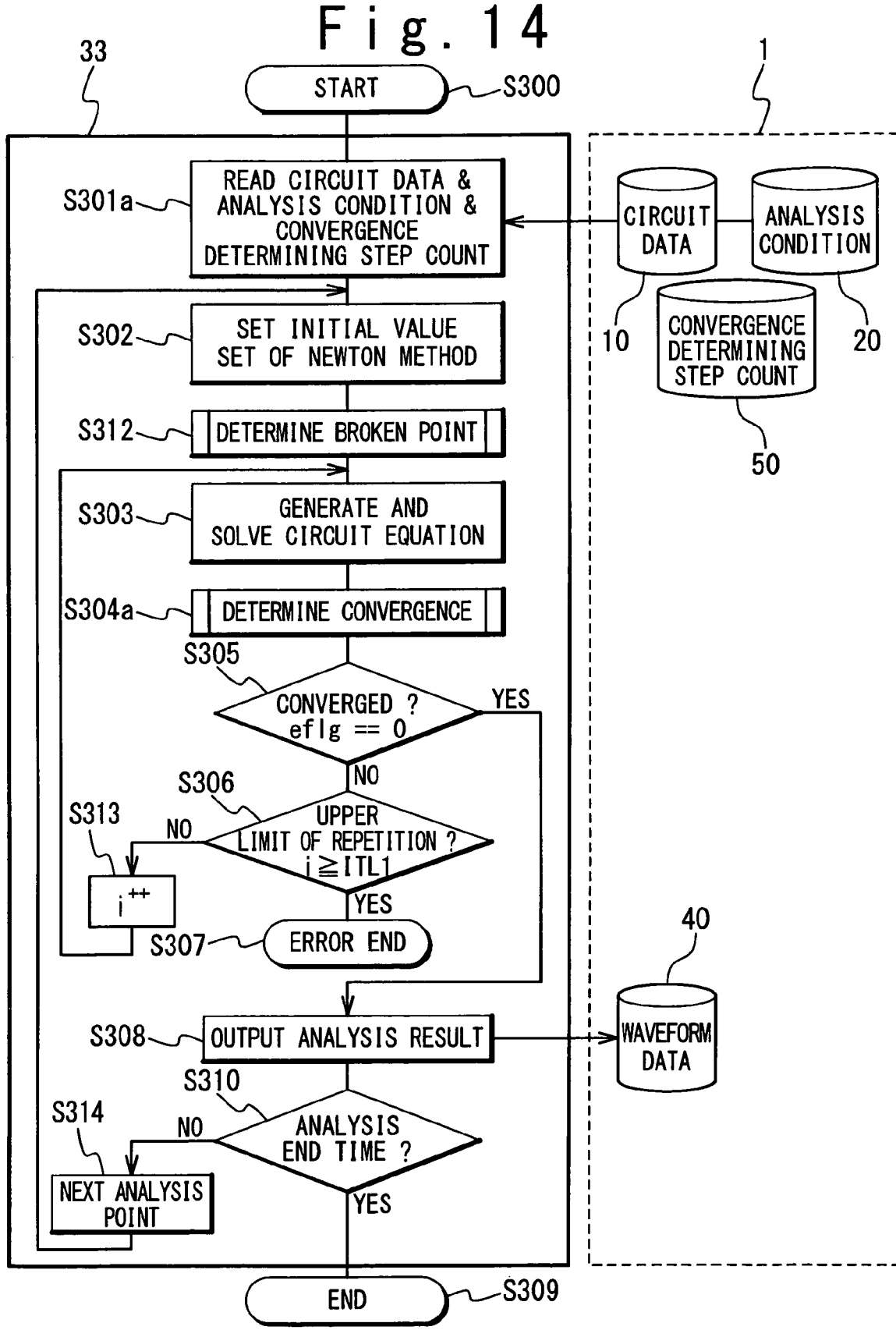
FIG. 14 is a flowchart of a transient analysis in the circuit simulation program according to a third embodiment of the present invention.

FIG. 14 is a flowchart showing a procedure of the circuit simulation method according to a third embodiment of the present invention. In the flowchart shown in FIG. 14, the Step S301 is replaced by Step S301a in the flowchart of the second embodiment of FIG. 10, and the number of convergence determination steps Nstep is determined from the number of convergence determination steps 50 which is set by the user. The other steps are the same, and consequently the same symbols are assigned. Therefore, in the third embodiment, it is possible to adjust the number of convergence determination steps Nstep depending on the circuit data 10.

Figure 15:
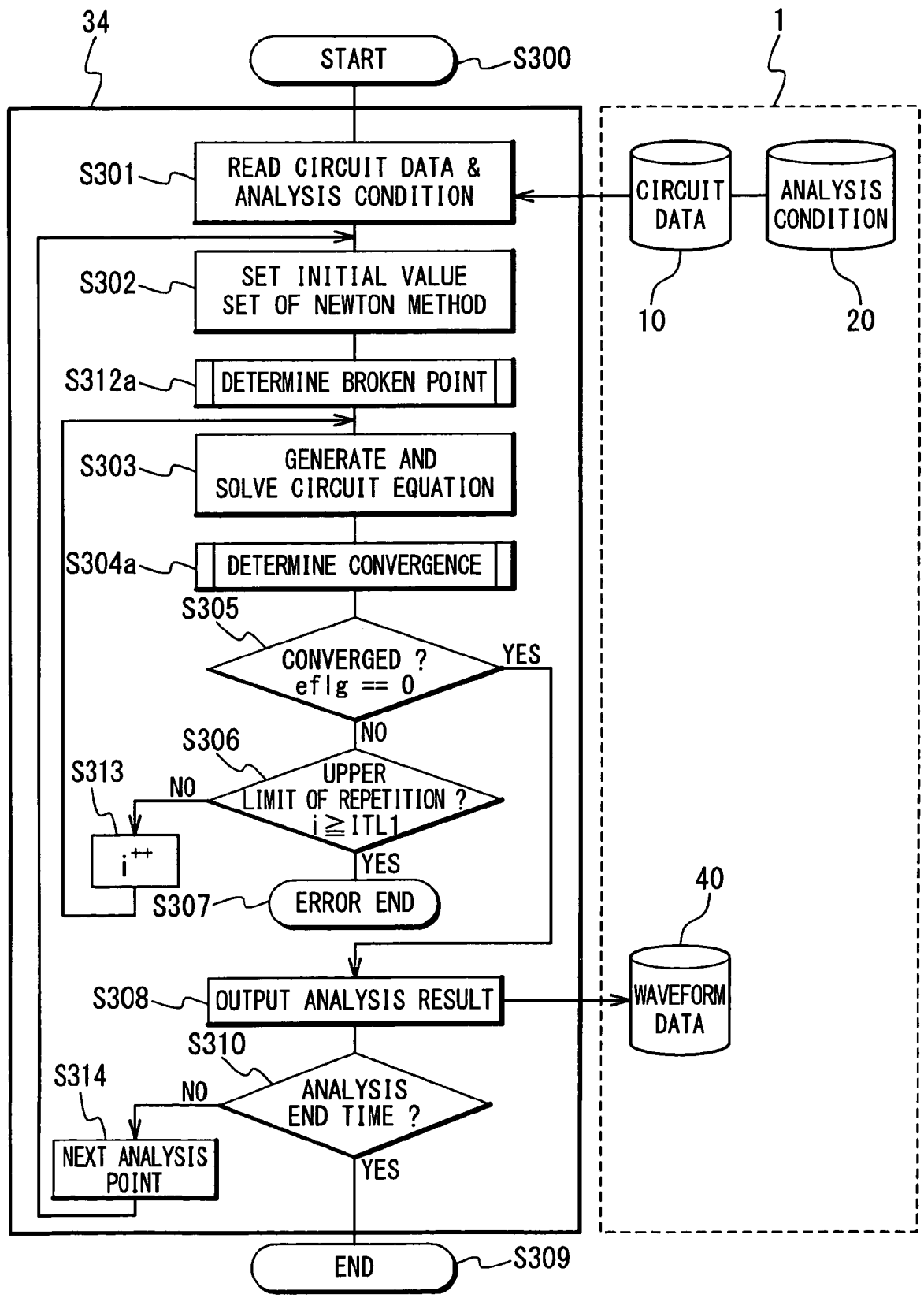
FIG. 15 is a flowchart of the transient analysis in the circuit simulation program according to a fourth embodiment of the present invention.
Figure 16:
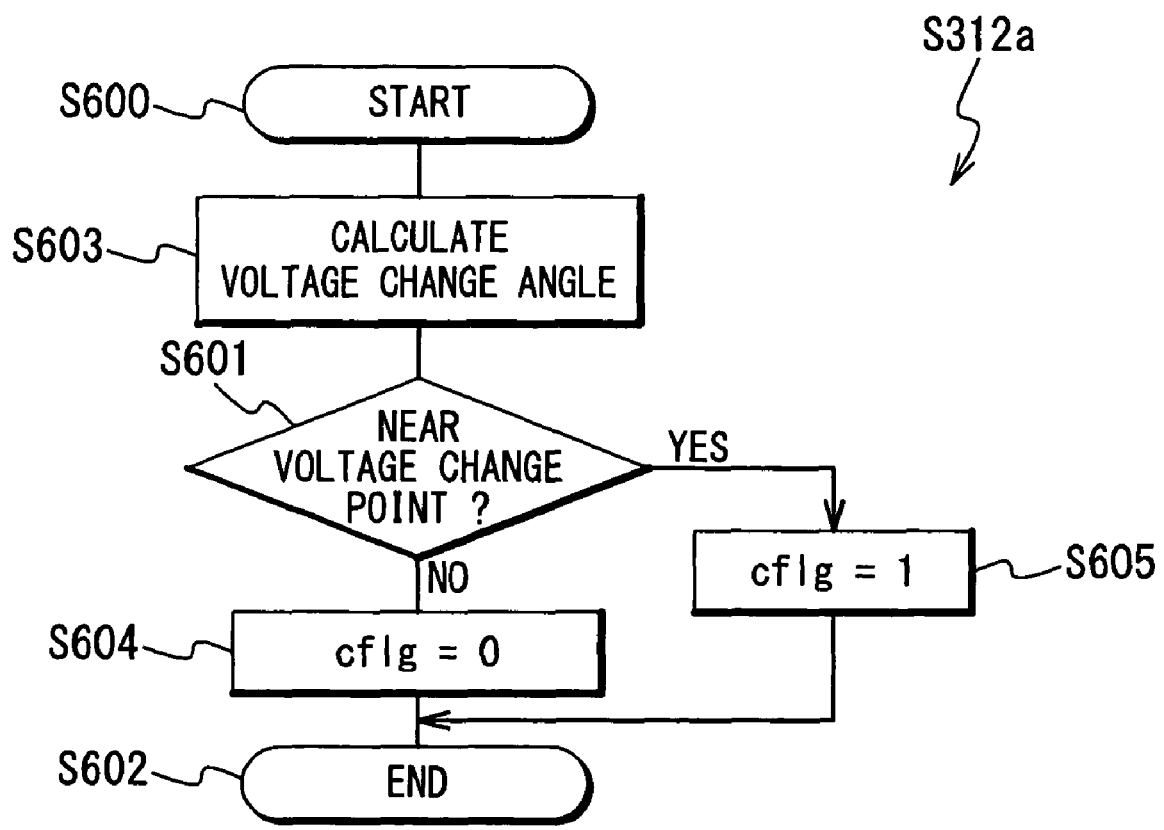
FIG. 16 is a flowchart showing a break point determining process in the circuit simulation method according to the fourth embodiment of the present invention.

Referring to a flowchart shown in FIG. 15, a procedure of the circuit simulation method according to a fourth embodiment of the present invention will be described. FIG. 15 includes a break point determining process (Step S312a), which improves the break point determining process in the second embodiment (Step S312 of FIG. 10). FIG. 16 is a flowchart showing the Step S312a, and a voltage change angle calculating process (Step S603) is added to the flowchart of FIG. 11. The other steps are the same, and consequently the same symbols are assigned.

Figure 11:
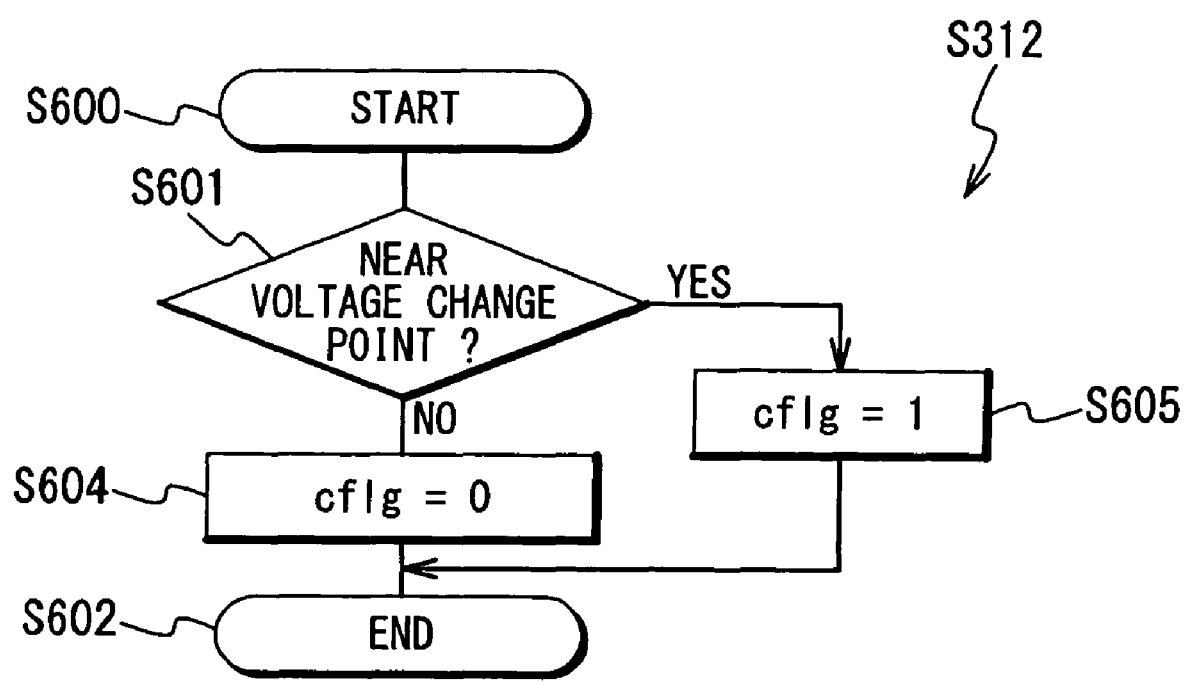
FIG. 11 is a flowchart showing a break point determining process in the circuit simulation method according to the second embodiment of the present invention.

In the voltage change angle calculating process (see Step S603), the number of convergence determination steps Nstep is set inside the circuit simulation program in advance at Step S601 of FIG. 11. Therefore, the number of convergence determination steps Nstep is a fixed value. In contrast to this, in the fourth embodiment, a process of calculating the number of convergence determination steps Nstep (Step S603) based on a rate of voltage change (angle) of a voltage source is added, and the number of convergence determination steps Nstep is adjusted based on the voltage change rate (angle). Therefore, in the fourth embodiment, the number of convergence determination steps is adjusted automatically depending on the voltage change rate (angle) in the circuit data 10. For this reason, it becomes unnecessary for the user to be conscious of the number of convergence determination steps, and the convergence determination of the current variable is not performed in such a gentle change that may not generate the spike.

In the conventional technique, the number of times of the iteration of the Newton iteration method required until calculating the solution is m times, which are larger than n times. The number of times of the operation required until calculating the solution can be expressed by a product of the average number of times of the operation per iteration of the Newton iteration method and the number of times of the iteration required to obtain the solution. Since the number of times of the operation of the circuit simulation method according to the present embodiment becomes n/m times, compared with that of the conventional technique, it is possible to reduce the number of times of the iteration of the Newton iteration method, and to speed up the analysis process.

Since the spike form of the current waveform at a voltage change point is corrected, a precision improvement of the current waveform can be obtained. Since the Newton iteration method in the transient analysis uses a solution of the last analysis point as an initial value set of the unknown variable X, the current value converges at a stage of less number of times of the iteration when the initial value set sufficiently close to the true solution is given in the Newton iteration method. Therefore, the current waveform does not take an abnormal form at analysis point that is other than the vicinity of the voltage change point and shows a gentle change in voltage.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A circuit simulation system, comprising:
a storage section configured to store a circuit data, an analysis condition data, and an output data;
an initial data setting section configured to read out the circuit data and the analysis condition data from said storage section and set an initial data and a convergence condition for a solution calculating process based on the circuit data and the analysis condition data;
a processing section configured to generate a circuit equation to each of a voltage variable and a current variable based on the circuit data, and execute the solution calculating process based on the initial data to calculate a solution;
a convergence determining section configured to execute a convergence determining process of whether or not the solution meets the convergence condition, on the voltage variable;
an output section configured to store the solution into the output data when the solution is determined to meet the convergence condition; and
a repetition control section configured to control said processing section to calculate a next solution by using the solution from the processing section as initial data, when the convergence determining section determines the solution does not meet the convergence condition.

2. The circuit simulation system according to claim 1, further comprising:
a neighborhood determining section configured to determine whether or not a present analysis point of a plurality of analysis points is in a vicinity of a change point of the voltage variable; and
a convergence determination control section configured to control said convergence determining section to execute the convergence determining process on the current variable in addition to the voltage variable, when the present analysis point is determined to be in the vicinity of the change point of the voltage variable.

3. The circuit simulation system according to claim 2, wherein said storage section stores a convergence determining step count data; and
wherein said neighborhood determining section determines whether the present analysis point is in the vicinity of the change point of the voltage variable where the convergence determining process is to be executed on the current variable, from the convergence determining step count data and the change point of the voltage variable.

4. The circuit simulation system according to claim 2, further comprising an adjusting section configured to automatically adjust the vicinity of the change point of the voltage variable for the convergence determining process to be executed on the current variable based on a change rate of the voltage variable.

5. The circuit simulation system according to claim 1, wherein the solution calculating process comprises a Newton iteration convergence method.

6. The circuit simulation system according to claim 5, wherein the convergence determining section is executed each time the Newton iteration convergence method is repeated.

7. The circuit simulation system according to claim 6, wherein, when the convergence determining section determines that the convergence condition is met, a counter variable of the Newton iteration method is measured to determine if the counter variable exceeds a predetermined limit based on the analysis condition data to stop the iteration.

8. A circuit simulation method, comprising:
setting an initial data and a convergence condition for a solution calculating process from a circuit data and an analysis condition data
generating a circuit equation to each of a voltage variable and a current variable based on the circuit data;
executing, on a processor of a computer, the solution calculating process based on the initial data to calculate a solution;
executing a convergence determining process of whether or not the solution meets the convergence condition, on the voltage variable;
storing the solution into a storage section when it is determined to meet the convergence condition; and
executing the solution calculating process and the convergence determining process by using the solution from the executing of the solution calculating process as initial data, when the executing of the convergence determining process determines the solution does not meet the convergence condition.

9. The circuit simulation method according to claim 8, further comprising:
   determining whether or not a present analysis point of a plurality of analysis points is in a vicinity of a change point of the voltage variable; and
   executing the convergence determining process on the current variable in addition to the voltage variable, when the present analysis point is determined to be in the vicinity of the change point of the voltage variable.

10. The circuit simulation method according to claim 9, wherein said executing the convergence determining process comprises determining whether the present analysis point is in the vicinity of the change point of the voltage variable for the convergence determining process to be executed on the current variable, from a convergence determining step count data specified by a user and the change point of the voltage variable.

11. The circuit simulation method according to claim 9, further comprising automatically adjusting the vicinity of the change point of the voltage variable for the convergence determining process to be executed on the current variable based on a change rate of the voltage variable.

12. A tangible computer-readable non-transitory recording medium in which a computer-executable program code is recorded for realizing a circuit simulation method, the method comprising:
   setting an initial data and a convergence condition for a solution calculating process from a circuit data and an analysis condition data;
   generating a circuit equation to each of a voltage variable and a current variable based on the circuit data;
   executing the solution calculating process based on the initial data to calculate a solution;
   executing a convergence determining process of whether or not the solution meets the convergence condition, on the voltage variable;
   storing the solution into a storage section when it is determined to meet the convergence condition; and
   executing the solution calculating process and the convergence determining process by using the solution from the executing of the solution calculating process as initial data, when the executing of the solution determines the solution does not meet the convergence condition.

13. The non-transitory recording medium according to claim 12, wherein the circuit simulation method further comprises:
   determining whether or not a present analysis point of a plurality of analysis points is in a vicinity of a change point of the voltage variable; and
   executing the convergence determining process on the current variable in addition to the voltage variable, when the present analysis point is determined to be in the vicinity of the change point of the voltage variable.

14. The non-transitory recording medium according to claim 13, wherein said executing the convergence determining process comprises determining whether the present analysis point is in the vicinity of the change point of the voltage variable for the convergence determining process to be executed on the current variable, from a convergence determining step count data specified by a user and the change point of the voltage variable.

15. The non-transitory recording medium according to claim 13, wherein the circuit simulation method further comprising automatically adjusting the vicinity of the change point of the voltage variable for the convergence determining process to be executed on the current variable based on a change rate of the voltage variable.

* * * * *